United States Patent
Tigelaar et al.

(10) Patent No.: US 7,539,044 B1
(45) Date of Patent: May 26, 2009

(54) MEMORY DEVICE WITH CAPACITOR AND DIODE

(75) Inventors: Howard Lee Tigelaar, Allen, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 26 days.

(21) Appl. No.: 11/961,064

(22) Filed: Dec. 20, 2007

(51) Int. Cl.
*G11C 11/24* (2006.01)
*G11C 11/36* (2006.01)

(52) U.S. Cl. ....................... 365/149; 365/175
(58) Field of Classification Search ............ 365/149
See application file for complete search history.

(56) References Cited

U.S. PATENT DOCUMENTS

| | | | | |
|---|---|---|---|---|
| 4,920,513 A | * | 4/1990 | Takeshita et al. | 365/175 |
| 4,922,319 A | * | 5/1990 | Fukushima | 257/379 |
| 5,483,482 A | * | 1/1996 | Yamada et al. | 365/175 |
| 5,691,935 A | * | 11/1997 | Douglass | 365/149 |
| 5,822,240 A | * | 10/1998 | Yoo | 365/145 |
| 5,875,127 A | * | 2/1999 | Yin | 365/185.2 |
| 7,031,182 B2 | * | 4/2006 | Beigel et al. | 365/149 |
| 7,072,203 B2 | * | 7/2006 | Kang | 365/145 |
| 2003/0174532 A1 | * | 9/2003 | Matsushita et al. | 365/145 |
| 2007/0133257 A1 | * | 6/2007 | Kim | 365/149 |

* cited by examiner

*Primary Examiner*—Son L Mai
(74) *Attorney, Agent, or Firm*—Rose Alyssa Keagy; Wade J. Brady, III; Frederick J. Telecky, Jr.

(57) ABSTRACT

One embodiment of the present invention relates to an integrated circuit that includes a memory cell. The memory cell includes a capacitor configured to store a charge or voltage. The capacitor includes a first semiconductor fin having a first conductivity type and overlying a semiconductor body, a dielectric overlying at least part of the semiconductor fin, and a gate electrode overlying the dielectric. The memory cell also includes a diode. The diode includes an end portion of the first semiconductor fin and a second semiconductor fin that forms a junction with the end portion of the first semiconductor fin. The second semiconductor fin has a second conductivity type and includes first and second legs in different directions from the junction. Other devices and methods are also disclosed.

20 Claims, 6 Drawing Sheets

MEMORY DEVICE WITH CAPACITOR AND DIODE

FIELD OF INVENTION

The present invention relates generally to semiconductor devices and more particularly to semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

Figure 1:
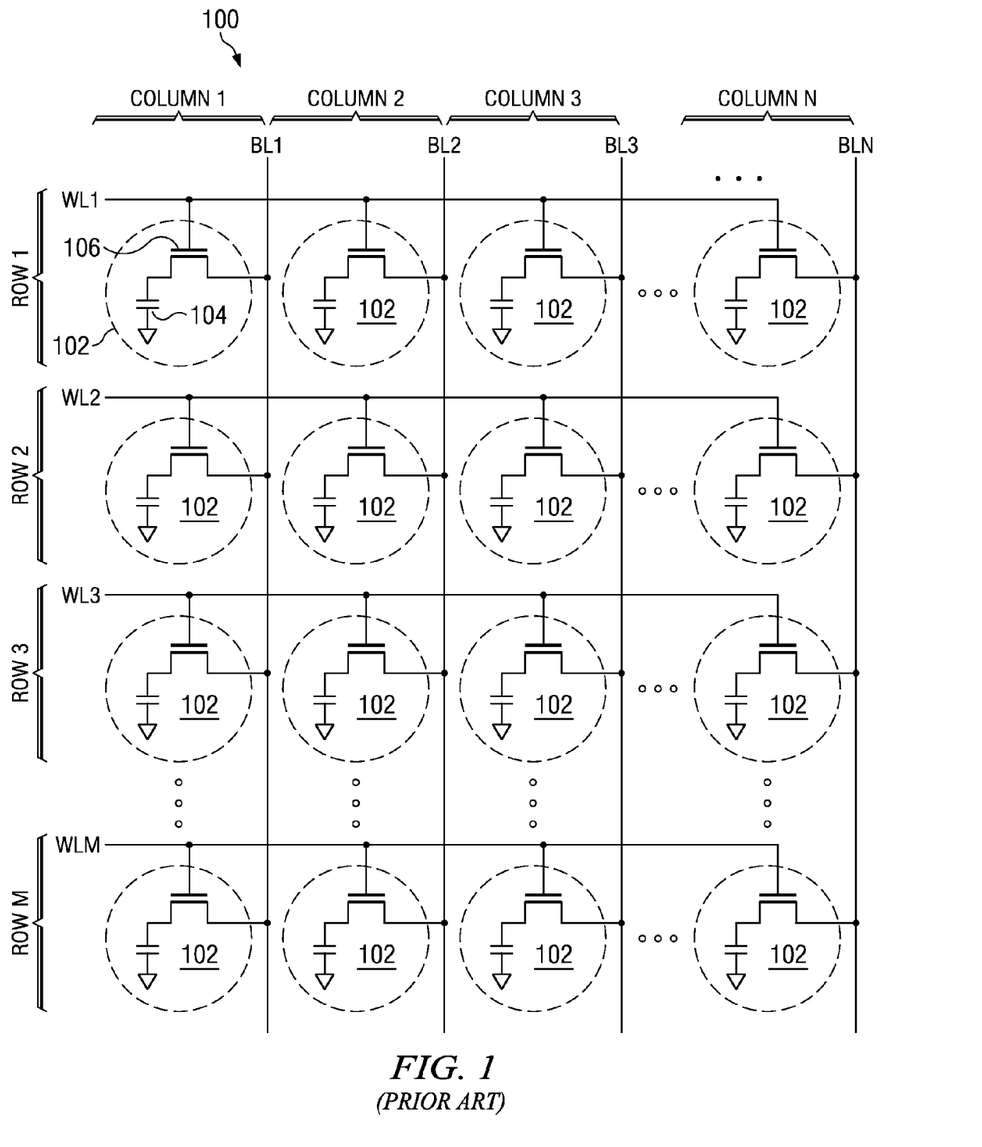
FIG. 1 shows an array of somewhat conventional DRAM memory cells.

Dynamic random access memory (DRAM) is one type of random access memory where individual bits of data are stored in separate capacitors arranged in an array-like manner. In FIG. 1, one can see a somewhat conventional DRAM memory array 100 that includes a number of memory cells 102, each of which includes a capacitor (e.g., 104) that is accessible via an access transistor (e.g., 106). The memory cells 102 are arranged in M rows (e.g., words) and N columns (e.g., bits). Each row of memory cells is an N bit data word accessible by activation of a wordline WL that is coupled to the access transistors of that row.

Because the capacitors leak charge, any data stored in the memory cells will fade unless it is refreshed periodically. Because of this characteristic, a DRAM is a dynamic memory, as opposed to SRAM and other types of static memory. When compared to SRAM, one advantage of DRAM is that it can have very high densities because of its simplistic memory cell structure.

Therefore, in many arenas when a large amount of data storage is desired, DRAM is often a relatively affordable solution. While existing types of DRAM are sufficient for their stated purpose, it would be useful to have new types of DRAM, particularly as new process technologies and devices emerge.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to an integrated circuit that includes a memory cell. The memory cell includes a capacitor configured to store a charge or voltage. The capacitor includes a first semiconductor fin having a first conductivity type and overlying a semiconductor body, a dielectric overlying at least part of the semiconductor fin, and a gate electrode overlying the dielectric. The memory cell also includes a diode. The diode includes an end portion of the first semiconductor fin and a second semiconductor fin that forms a junction with the end portion of the first semiconductor fin. The second semiconductor fin has a second conductivity type and includes first and second legs in different directions from the junction. Other devices and methods are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

Figure 2:
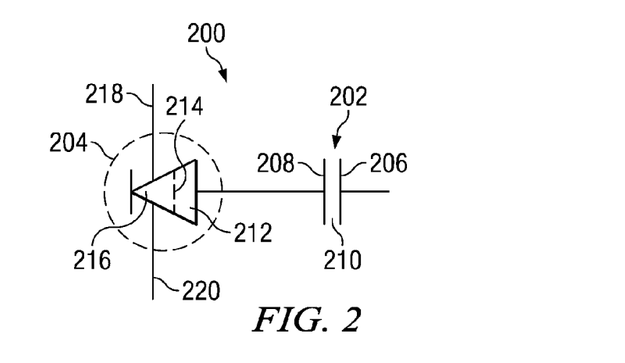
FIG. 2 shows a memory cell in accordance with some aspects of the present invention.

Referring now to FIG. 2, one can see one example of a memory cell 200 in accordance with aspects of the present invention. The memory cell 200 includes a capacitor 202 and a diode 204 coupled thereto. More specifically, the capacitor 202 includes a first plate 206 and a second plate 208, between which a dielectric 210 is sandwiched. The diode 204 comprises an anode 212 that forms a junction 214 with a cathode 216. The cathode 216 includes a first leg 218 and a second leg 220 that extend in different directions from the junction 214. A number of these memory cells 200 could be arranged to form a memory array for storing digitally encoded data.

In one embodiment, a resistance measured between the first leg 218 and second leg 220 is indicative of a data state stored in the cell 200. By changing the amount of charge stored in the capacitor 202 (and thus changing the bias across the diode), the resistance between the first and second legs 218, 220 can be altered. For example, in one implementation where the cell stores a single bit (e.g., a logical "0" or a logical "1"), a relatively large charge or voltage in the capacitor 202 can correspond to a relatively-low resistance state ($R_L$), while a relatively small charge or voltage can correspond to a relatively-high resistance state ($R_H$). $R_H$ could then be assigned to a logical "0" and $R_L$ could then be assigned to a logical "1", or vice versa.

In another embodiment, the current the memory cell provides is indicative of the data state stored in the cell. For example, while the diode is reverse biased, different charges or voltages could be stored in the capacitor 202. When the diode is reversed biased, the charge will flow from the cell. If a relatively large amount of charge was stored, the cell will provide a relatively-high current ($I_H$). By contrast, if a relatively small amount of charge was stored, the cell will provide a relatively-low current ($I_L$). $I_H$ could then be assigned to a logical "0" and $I_L$ could then be assigned to a logical "1", or vice versa.

Figure 3:
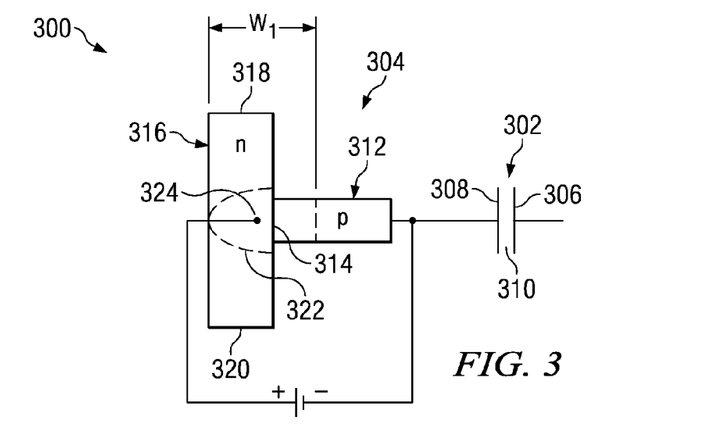
FIGS. 3-4 show functional schematics of the memory cell with different amounts of charge on the capacitor, where different depletion widths are associated therewith.
Figure 4:
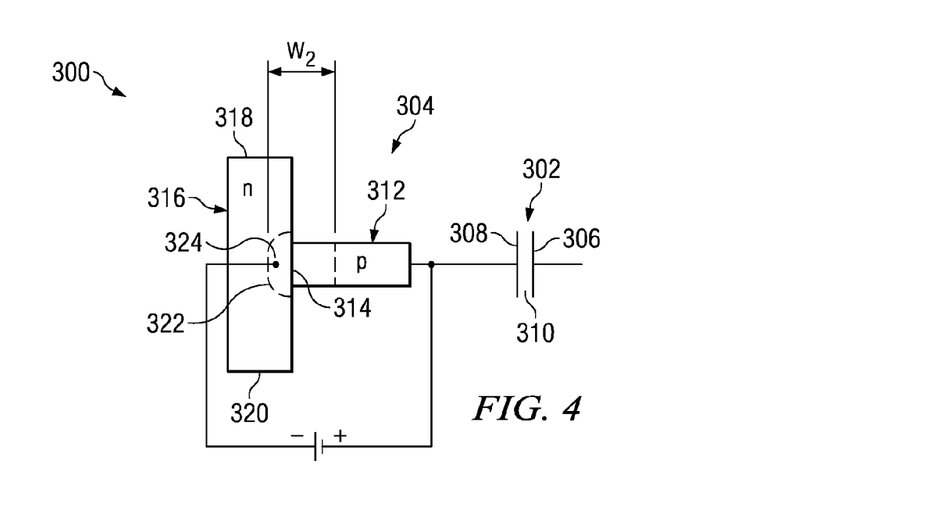

FIGS. 3-4 discuss a more detailed embodiment of a memory cell 300 with a p-n junction diode, and various bias conditions applied thereto. As shown in these figures, the memory cell 300 includes a capacitor 302 with a first plate 306 and a second plate 308, as well as a diode 304 that includes a p-type region 312 with an end portion that forms a junction 314 with an n-type region 316. The n-type region 316 includes first and second legs 318, 320, respectively, that extend in different directions from the junction 314. In some embodiments, the first and second legs 318, 320 of the n-type region could have sidewalls that are aligned with the p-type region's sidewalls—in other words the first and second legs 318, 320 could have an effective length of approximately zero.

More particularly, FIG. 3 shows the memory cell 300 where a reverse bias is applied to the p-n diode 304. While the reverse bias condition is applied, current will not flow through the diode, absent breakdown. In one embodiment this reverse bias condition could correspond to a relatively high-resistance state $R_H$. More specifically, this relatively high resistance is due to the lack of carriers in a relatively wide depletion region 322. Because the depletion width, $w_1$, impinges substantially across the n-type region 316, the memory cell 300 will have a relatively high resistance $R_H$ between the first leg 318 and the second leg 320. Because the depletion width, $w_1$, is a function of the voltage across the junction 314 (as well as the doping concentrations within the n-type region 316 and p-type region 312), the depletion width, $w_1$, could be a function of the charge or voltage stored in the capacitor 302.

FIG. 4 shows the memory cell 300 where the p-n diode 304 is forward biased. While the forward bias condition is applied, current will flow through the diode. Further, in this forward bias condition the depletion region 322 may recede within the n-type region 316, thereby increasing the number of carriers available and decreasing the resistance between the first and second legs 318, 320. Thus, FIG. 4 shows the memory cell in a relatively low-resistance state $R_L$, which has a relatively narrow depletion width $w_2$, where $w_2 < w_1$ and therefore where $R_L < R_H$.

Figure 5:
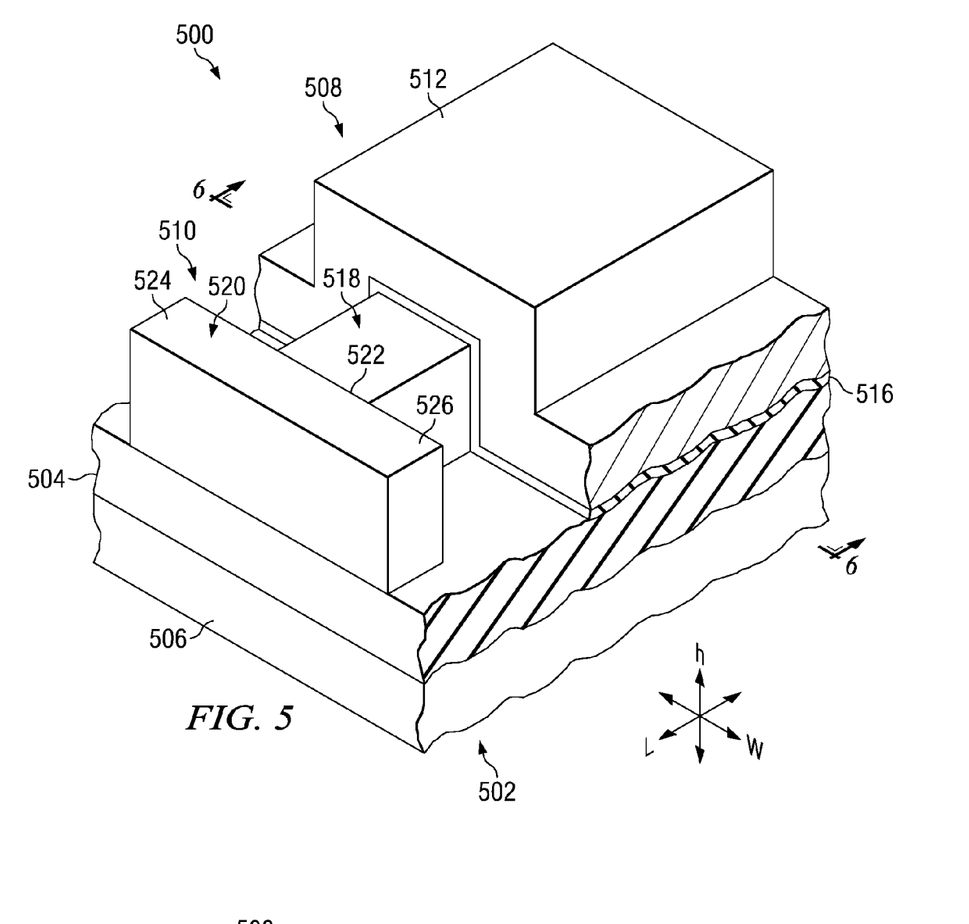
FIGS. 5-6 show one embodiment of a memory cell that employs a three dimensional capacitor structure.
Figure 6:
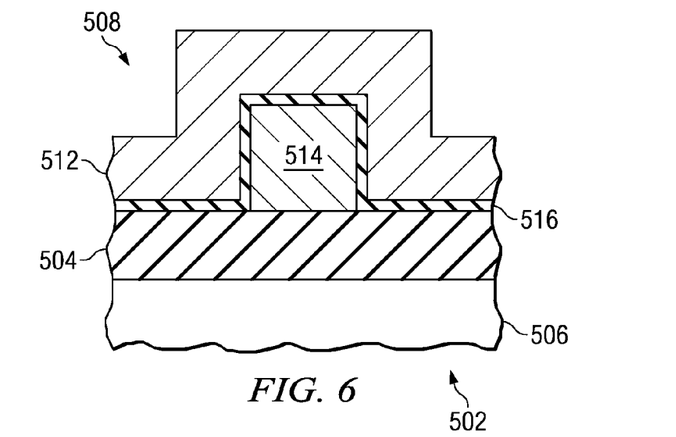

Depending on the implementation, memory cells in accordance with the invention could be formed using three-dimensional (e.g., Multi-Gate Field Effect Transistors (MuGFET)) techniques, or using planar SOI. Referring now to FIG. 5-6, one can see an embodiment where a memory cell 500 is formed using MuGFET techniques. As shown, the memory cell 500 may be formed over a semiconductor body 502 that comprises an insulator layer 504 and a semiconductor substrate layer 506. The memory cell 500 includes a capacitor 508 and a diode 510 formed over the semiconductor body.

The capacitor 508, which may have a cross section as shown in FIG. 6, comprises a gate electrode 512 that straddles at least one semiconductor fin 514, which may also be referred to as a first semiconductor fin in some embodiments. A dielectric layer 516 is sandwiched between the semiconductor fin 514 and the gate electrode 512, and electrically separates the semiconductor fin 514 from the gate electrode 512. Thus, when charge is stored in the capacitor 508, the gate electrode 512 acts as a first capacitor plate and the semiconductor fin 514 acts as a second capacitor plate.

In some embodiments, the capacitor 508 may include multiple semiconductor fins that extend under the gate electrode 512. In essence, the presence of multiple semiconductor fins may give the capacitor 508 a greater surface area between its plates, and may therefore provide higher capacitances, and/or more precisely matched capacitances. In various embodiments, the at least one semiconductor fin 514 under the gate electrode 512 may be made of un-doped silicon or p-type silicon, although it could also be made of other materials. For example, the semiconductor fin could also be made of Gallium Arsenide (GaAs), or other semiconductor materials.

The diode 510 includes an end portion 518 of the first semiconductor fin 514 and a second semiconductor fin 520, where the end portion 518 and the second semiconductor fin 520 form a junction 522 therebetween. The end portion 518 may extend beyond an edge of the gate electrode 512 and is typically made of p-type silicon. At least a region within the second semiconductor fin 520 is made of n-type semiconductor (e.g., n-type silicon), where the region corresponds to a depletion region.

As shown, the second semiconductor fin 520 includes a first leg 524 extending in one direction from the junction 522 and a second leg 526 extending in another direction from the junction 522. In one embodiment, the first and second legs 524, 526 are precisely or substantially aligned along a first axis. In typical embodiments, the first axis could be precisely or substantially perpendicular to a second axis along which the end portion 518 of the first semiconductor fin extends. Other alignments are also contemplated as falling within the scope of the invention.

During operation, the amount of charge or voltage on the capacitor 508 is changed, which changes the width of a depletion region near the junction 522. In one embodiment, this change in the width of the depletion region changes the resistance between the first and second legs 524, 526, thereby storing different resistance states in memory cell 500 in a manner similar to that previously discussed with reference to FIGS. 3-4. In another embodiment, this charge or voltage on the capacitor 508 could be associated with a current delivered by the memory cell.

Figure 7:
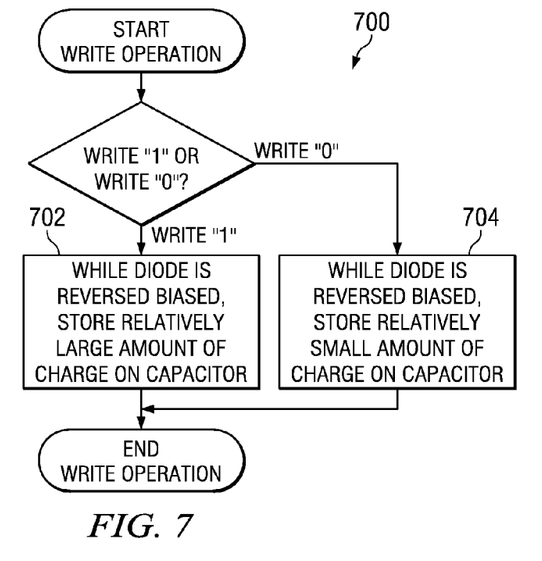
FIGS. 7-8 show one embodiment of a method of writing to and reading from a memory cell using a current sensing scheme.
Figure 8:
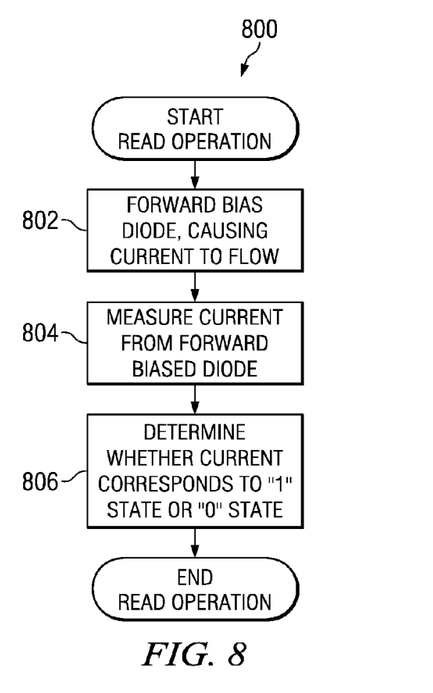
Figure 9:
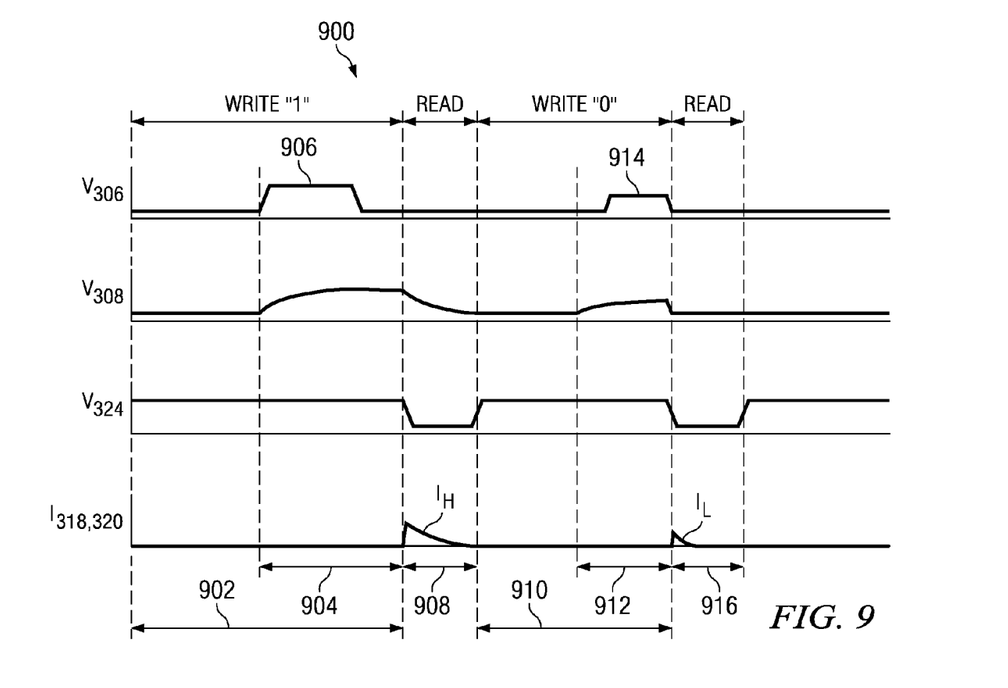
FIG. 9 shows waveforms consistent with one example of the method of FIGS. 7-8.
Figure 10:
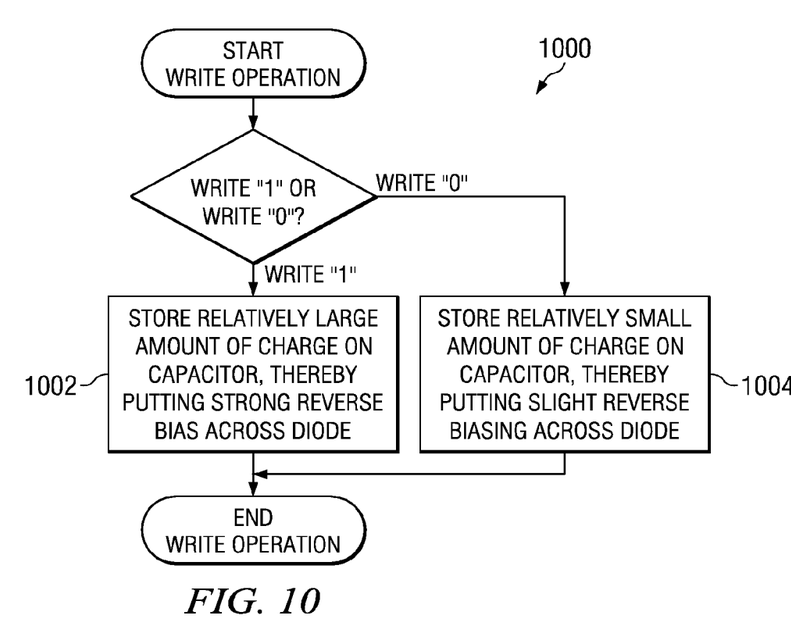
FIGS. 10-11 show one embodiment of a method of writing to and reading from a memory cell using a variable resistance scheme.
Figure 11:
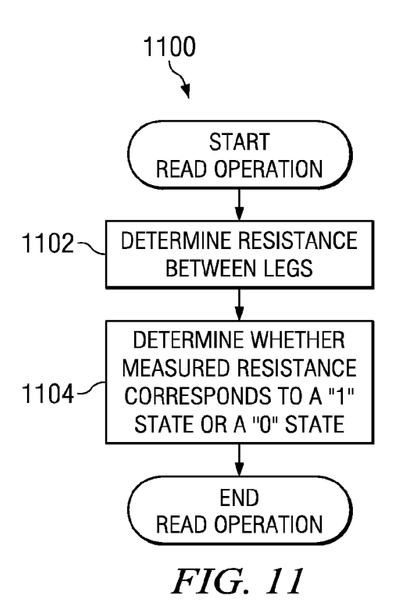
Figure 12:
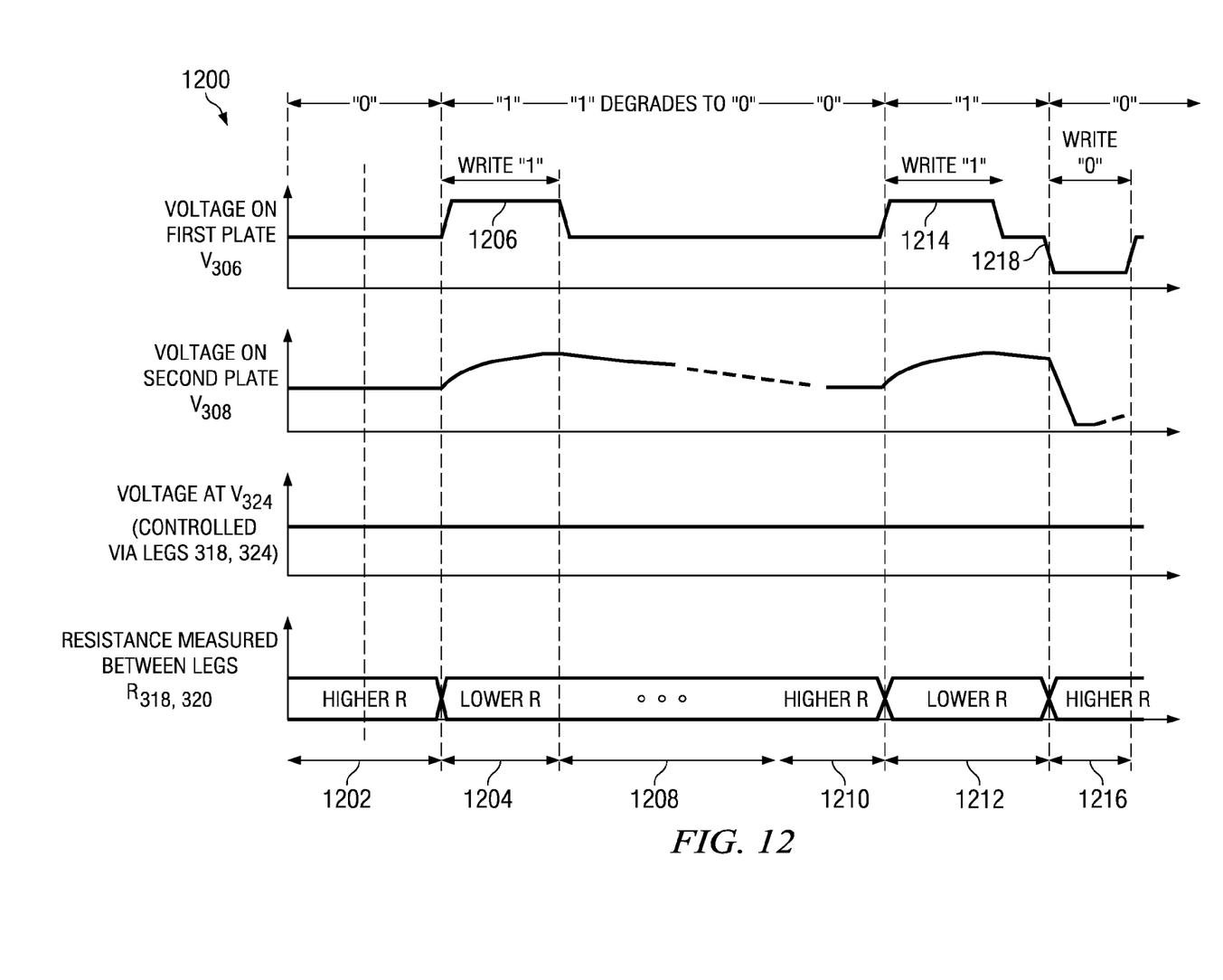
FIG. 12 shows waveforms consistent with one example of the method of FIGS. 10-11.

Now that several embodiments of a memory cell in accordance with aspects of the invention have been set forth, FIGS. 7-12 present examples of methods used to read to and write from such a memory cell 200, 300, 500. More particularly, FIGS. 7-9 show a method in which a current sensing scheme is used to determine a data state stored in the cell, while FIGS. 10-12 show a method where a resistance sensing scheme is used to determine the data state stored in the cell. Although these methods may be illustrated with reference to writing a "1" state and a "0" state, it will be appreciated that these states could be reversed in other embodiments. Further, although the methods discussed below may be discussed with reference to the memory cell 300 in FIGS. 3-4, it will be appreciated that these circuits and methods are also applicable to other memory cells. Further, even though this example is described in terms of a single accessed cell for purposes of clarity and readability, it will be appreciated that this example could be extended an array of memory cells.

FIGS. 7-8 a somewhat general method for writing to and reading from memory cell using a current sensing scheme. In FIG. 7, the method 700 starts when a determination is made whether a "1" or "0" is to be written to the cell. If a "1" is to be written, the method proceeds to 702 where a relatively large amount of charge or a relatively high voltage is stored on the capacitor while the diode is reversed biased. By contrast, if a "0" is to be written, the method proceeds to 704 where a relatively small amount of charge or a relatively low voltage is stored on the capacitor while the diode is reversed biased.

In FIG. 8, a read operation is accomplished by forward biasing the diode, thereby causing current to flow in 802. The current may be proportional to the amount of charge that had been stored in the capacitor. In 804 the current is measured, and in 806 a determination is made whether the current corresponds to a "1" state or a "0" state.

FIG. 9 shows a more detailed timing diagram 900 in which a current sensing scheme is used to determine the state of the memory cell. For purposes of clarity, the waveforms in this example have been chosen to correspond to various nodes in FIGS. 3-4 (i.e., $V_{306}$ corresponds to the voltage on the second plate 306 of the capacitor 302, $I_{318,320}$ corresponds to a current injected into the first and second legs 318, 320, etc.).

To write a "1" state at time 902, a reverse bias is applied to the diode 304 (i.e., $V_{324}$ is greater than $V_{308}$). Thus, the reversed biased diode will block current from flowing across the p-n junction. At time 904 while the reverse bias is applied, a first voltage pulse 906 is applied to store a relatively large charge or voltage in the capacitor 302. As the capacitor is charged, the voltage on the second plate $V_{308}$ also rises. When the first voltage pulse 906 is stopped, the voltage on the second plate $V_{308}$ will slowly degrade (which may require periodic refresh operations).

To read the cell at 908, voltage $V_{324}$ is pulsed low, which forward biases the diode 304 and allows current to flow from the capacitor 302 into the first and second legs 318, 320. Since this current will be proportional to the amount of charge stored in the capacitor 302, a relatively high-current ($I_H$) will be measured (e.g., a "1" state). Because the read operation drains the charge stored in the capacitor 302, the read is said to be destructive. Therefore, although not shown in FIG. 9, a memory device would often write back the data to the cell to preserve the data state for future accesses.

To write a "0" state, $V_{324}$ is raised high to again reverse bias the diode 304 at time 910. At 912 while the reverse bias is applied, a second voltage pulse 914 is applied to store a relative small charge or voltage in the capacitor 302. As the capacitor is charged, $V_{308}$ rises, albeit to a relatively low voltage. Now when the cell is again read at 916 by pulsing $V_{324}$ low, the cell will inject a relatively low current ($I_L$) into the first and second legs 318, 320. In this example, the relatively low current is indicative of the "0" state as shown.

Referring now to FIGS. 10-11, one can see a somewhat general method for writing to and reading from the memory cells using a variable resistance scheme.

In FIG. 10, the method 1000 starts when a determination is made whether a "1" or "0" is to be written to the cell. If a "1" is to be written, the method proceeds to 1002 where a relatively large amount of charge or a relatively high voltage is stored on the capacitor. By contrast, if a "0" is to be written, the method proceeds to 1004 where a relatively small amount of charge or a relatively low voltage is stored on the capacitor.

In FIG. 11, a read operation is accomplished by measuring the resistance between the first and second legs in 1102. In 1104, a determination is made whether the measured resistance corresponds to a "1" state or a "0" state.

FIG. 12 shows a more detailed timing diagram 1200 for a variable resistance scheme showing voltages and currents at various nodes in the memory cell. As with FIG. 9, the node voltages in this example have been chosen to correspond to the example in FIGS. 3-4 (i.e., $V_{306}$ corresponds to the voltage on the second plate 306 of the capacitor 302, $R_{318,320}$ corresponds to a resistance measured between the first and second legs 318, 320, etc.)

To write a "0" state, the diode is strongly reversed biased at time 1202. Thus, due to the relatively large depletion region, a relatively high resistance ($R_H$) will be measured between the first and second legs 318, 320.

At time 1204, a third voltage pulse 1206 is applied to store a relatively large charge or voltage in the capacitor 302. This causes voltage $V_{308}$ to rise, which reduces the reverse bias over the diode (i.e., the diode now has a smaller forward bias over it). Accordingly, because the depletion width will now be smaller, the cell will have a relatively low resistance ($R_L$) between the first and second legs at this time 1204.

At time 1208, the charge or voltage gradually leaks from $V_{308}$, causing the diode to be become more strongly reversed biased. Thus, the resistance between the first and second legs will increase during this time. Although not shown, refresh operations could be used to periodically refresh the charge or voltage in the capacitor to keep any desired bias condition. At some time 1210, the cell may again come to be within the strongly reversed biased state ($R_H$).

At 1212, a "1" is again written to the cell by use of a voltage pulse 1214. However, as the charge is slowly leaking from the second plate of the capacitor, at time 1216 a fourth voltage pulse 1218 with a negative voltage is applied. This fourth voltage pulse puts a strong reverse bias across the diode, again putting it into the high resistance state. Therefore, by charging or discharging the capacitor of the memory cell, one can see that the resistance of the cell can be altered to correspond to one of at least two data states.

Figure 13:
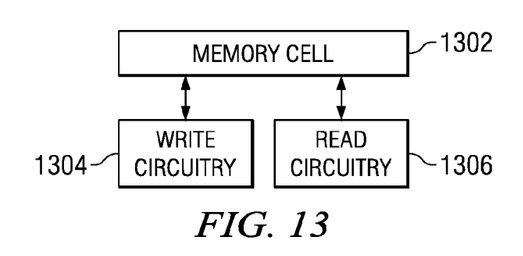
FIG. 13 shows one embodiment of circuitry that can be used to write to and read from a memory cell.

In view of the previously discussed figures and accompanying discussion, reference is now made to FIG. 13, which shows a memory cell 1302 and associated write circuitry 1304 and write circuitry 1306 to enable the functionality previously illustrated and described.

In some embodiments, the relatively high resistance $R_H$ could be approximately ten times as large as the relatively low resistance $R_L$. For example, the relatively high resistance could be about 100 kilo-ohms, while the relatively low resistance could be about 10 kilo-ohms In various embodiments, more than two resistance states could be associated with corresponding data states to implement a multi-bit cell with more than two states per cell. For example, four resistance states could be used to store two bits within each cell (e.g., "00", "01", "10", and "11"). Higher numbers of resistance states could also be used.

Depending on the implementation, the memory cell 200 may be fabricated with varying levels of integration. For example, in one embodiment the capacitor 202 and diode 204 may be manufactured on a single die on a silicon wafer, often with a number of such memory cells arranged in an array-like manner. This integrated circuit would generally also include sense amps and control circuitry (e.g., an address decoder and refresh circuit) that efficiently move data to and from the chip. In other embodiments, by contrast, the capacitor 202 may be manufactured as one discrete component while the diode 204 may be manufactured as another discrete component. Other variations are also contemplated as falling within the scope of the invention.

Although the invention has been illustrated and described with respect to one or more implementations, alterations and/or modifications may be made to the illustrated examples without departing from the spirit and scope of the appended claims. For example, although specific embodiments may be discussed above in the context of a p-n junction diode, it will be appreciated that aspects of the invention could also be applicable to other types of diodes, such as Schottky diodes, light emitting diodes (LEDs), etc. Further, the p-region and n-region may be swapped in other embodiments, and the corresponding voltage biases would also be swapped, where these embodiments are contemplated as being equivalents for the purposes of the invention.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
    a capacitor configured to store a charge or voltage between first and second plates;
    a diode having an anode coupled to the second plate of the capacitor, and a cathode forming a junction with the anode; where the cathode has a first leg in one direction from the junction and a second leg in another direction from the junction.

2. The memory device of claim 1, further comprising:
    write circuitry configured to adjust the charge or voltage on the capacitor, thereby adjusting a resistance between the first and second legs, and
    read circuitry configured to measure the resistance between the first and second legs, where the measured resistance is associated with at least two data states.

3. The memory device of claim 2, where the resistance between the first and second legs is a function of a width of a depletion region that extends into the cathode near the junction.

4. The memory device of claim 2, where a resistance between the first and second legs is decreased as the amount of charge or voltage is increased.

5. The memory device of claim 2, where the write circuitry is configured to vary the resistance between a high-resistance state and a low-resistance state.

6. The memory device of claim 5, where the high-resistance state corresponds to approximately 100 kilo-ohms.

7. The memory device of claim 5, where the high-resistance state has a resistance that is at least approximately 10 times a resistance of the low-resistance state.

8. The memory device of claim 2, where the read circuitry is configured to determine the resistance between more than two resistance states.

9. The memory device of claim 1, further comprising:
    write circuitry configured to adjust the charge or voltage on the capacitor while the diode is reverse biased, and
    read circuitry configured to forward bias the diode and measure a current related to the charge or voltage on the capacitor, where the measured current is associated with at least two data states.

10. The memory device of claim 9, where the capacitor comprises: a first semiconductor fin overlying a semiconductor body, a dielectric overlying at least part of the semiconductor fin, and a gate electrode overlying the dielectric.

11. An integrated circuit that includes a memory cell, comprising:
    a capacitor configured to store a charge or voltage, comprising: a first semiconductor fin overlying a semiconductor body, a dielectric overlying at least part of the semiconductor fin, and a gate electrode overlying the dielectric; and
    a diode comprising: an end portion of the first semiconductor fin having a first conductivity type; a second semiconductor fin that forms a junction with the end portion of the first semiconductor fin, the second semiconductor fin having a second conductivity type and including first and second legs in different directions from the junction.

12. The integrated circuit of claim 11, where the end portion of the first semiconductor fin is n-type and the second semiconductor fin is p-type.

13. The integrated circuit of claim 12, where the part of the semiconductor fin which the dielectric overlies comprises un-doped silicon.

14. The integrated circuit of claim 11, where the end portion of the first semiconductor fin extends outwardly beyond an edge of the gate electrode.

15. The integrated circuit of claim 11, where the semiconductor body comprises:
    a semiconductor substrate layer; and
    an insulator layer formed over the semiconductor substrate layer.

16. The integrated circuit of claim 15, where the semiconductor substrate layer, first fin, and second fin comprise silicon.

17. The memory device of claim 11, where the capacitor further comprises:
    additional semiconductor fins under the dielectric and gate electrode.

18. The memory device of claim 11, further comprising:
    write circuitry configured to adjust the charge or voltage on the capacitor while the diode is reverse biased, and
    read circuitry configured to forward bias the diode thereby creating a current related to the charge or voltage on the capacitor, and configured to measure the current, where the measured current is associated with at least two data states.

19. The memory device of claim 11, further comprising:
    write circuitry configured to adjust the charge or voltage on the capacitor, thereby adjusting a resistance between the first and second legs, and
    read circuitry configured to measure the resistance between the first and second legs, where the measured resistance is associated with at least two data states.

20. The memory device of claim 11, where the resistance between the first and second legs is a function of a width of a depletion region that extends into the n-type region near the junction.

* * * * *